(12) United States Patent
Kaiser et al.

(10) Patent No.: US 7,808,272 B2
(45) Date of Patent: Oct. 5, 2010

(54) INTEGRATED CIRCUIT

(75) Inventors: Robert Kaiser, Kaufering (DE); Florian Schamberger, Bad Reichenhall (DE)

(73) Assignee: Qimonda AG, Munich (DE)

( * ) Notice: Subject to any disclaimer, the term of this patent is extended or adjusted under 35 U.S.C. 154(b) by 1245 days.

(21) Appl. No.: 11/296,698

(22) Filed: Dec. 8, 2005

(65) Prior Publication Data

US 2006/0265440 A1 Nov. 23, 2006

(30) Foreign Application Priority Data

Dec. 9, 2004 (DE) ................. 10 2004 059 447

(51) Int. Cl.
*H03K 19/173* (2006.01)
(52) U.S. Cl. .................. 326/46; 326/93; 327/294
(58) Field of Classification Search .............. 326/46, 326/40, 93; 327/291, 294
See application file for complete search history.

(56) References Cited

U.S. PATENT DOCUMENTS 6,507,230 B1 * 1/2003 Milton .................. 327/291

2003/0043935 A1 3/2003 Noh

FOREIGN PATENT DOCUMENTS

| EP | 0074 847 A1 | 3/1983 |
| EP | 0 748 047 A1 | 12/1996 |

* cited by examiner

*Primary Examiner*—Daniel D Chang
(74) *Attorney, Agent, or Firm*—Edell, Shapiro & Finnan (57) ABSTRACT

An integrated circuit for analyzing the waveform of an input signal includes a first storage circuit and a second storage circuit that are each supplied with the input signal. The first and second storage circuits are controlled by a clock signal. The first storage circuit is used to store a state for the input signal when the clock signal has a rising edge. The second storage circuit is used to store a state for the input signal when the clock signal has a falling edge. An evaluation circuit compares the states of the input signal that are stored in the first and second storage circuits during a selected time span. The comparison can be used to decide whether the input signal assumes periodic fluctuations or an approximately permanently static value during the time span.

13 Claims, 9 Drawing Sheets

INTEGRATED CIRCUIT

CROSS REFERENCE TO RELATED APPLICATIONS

This application claims priority under 35 USC §119 to German Application No. DE 102004059447.3, filed on Dec. 9, 2004, and titled "Integrated Circuit," the entire contents of which are hereby incorporated by reference.

FIELD OF THE INVENTION

The present invention relates to an integrated circuit for analyzing a waveform for an input signal in the integrated circuit.

BACKGROUND

Figure 1:
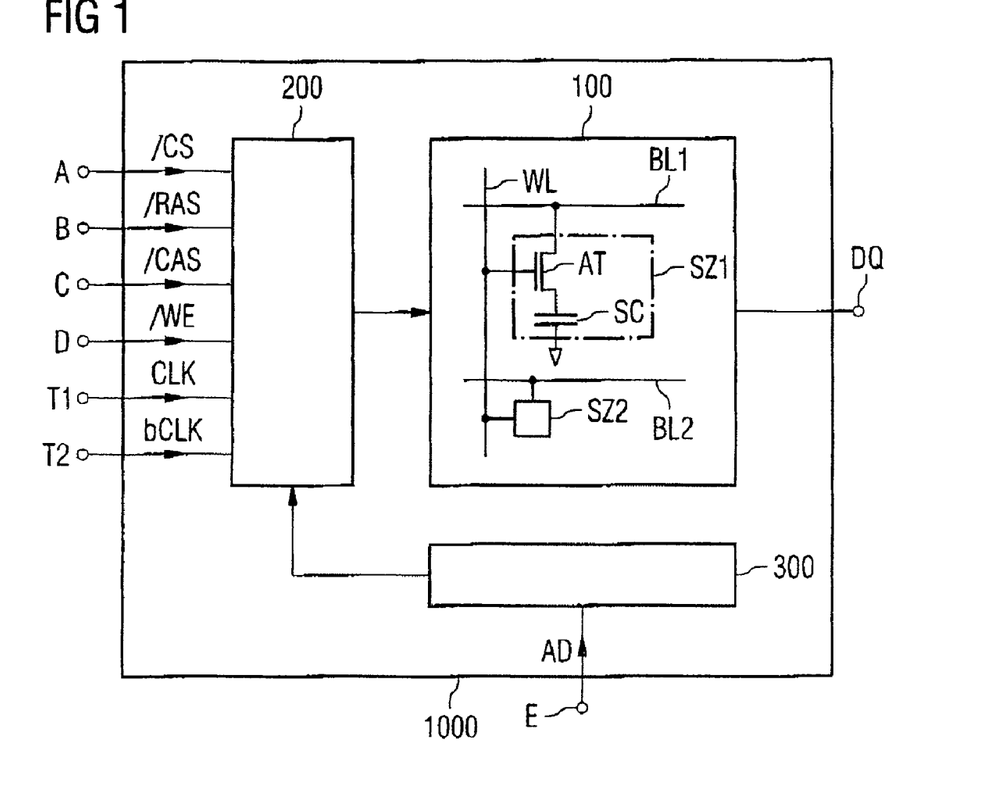
FIG. 1 depicts an integrated semiconductor memory device which is operated in sync with the waveform of a control clock.

FIG. 1 shows an integrated semiconductor memory device 1000 which is in the form of a DRAM (dynamic random access memory) semiconductor memory, for example. The integrated semiconductor memory device comprises a memory cell array 100 in which memory cells are arranged in matrix form along word lines and bit lines. FIG. 1 shows two memory cells SZ1 and SZ2 by way of example, these being connected between a word line WL and a bit line BL1 or BL2. A DRAM memory cell comprises a selection transistor AT and a storage capacitor SC. An appropriate control signal on the word line WL can be used to turn on the selection transistor AT, so that the storage capacitor SC is conductively connected to the bit line which is connected to it.

To control read and write access operations to the memory cells in the integrated semiconductor memory device, a control circuit 200 is used which is connected to an external connection A for applying a control signal /CS, to an external connection B for applying a control signal /RAS, to an external connection C for applying an external control signal /CAS and to an external connection D for applying a control signal /WE. In addition, the control circuit 200 is connected to a clock connection T1 for applying a clock signal CLK and to a clock connection T2 for applying a clock signal bCLK. To select a memory cell within the memory cell array 100, the integrated semiconductor memory device has an address register 300 with an external connection E for applying an address signal AD.

Figure 2:
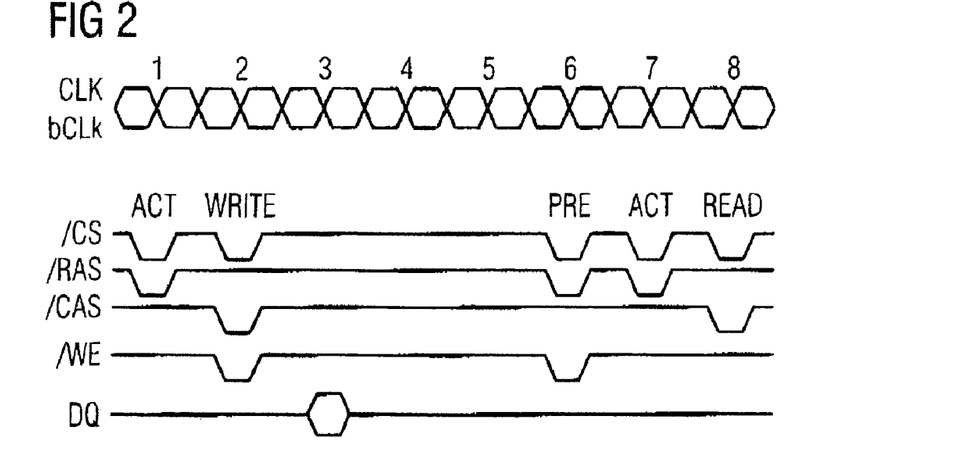
FIG. 2 depicts the waveform of control signals in an integrated semiconductor memory device in sync with the waveform of a control clock for read and write access.

FIG. 2 shows the waveform of the control signals /CS, /RAS, /CAS and /WE for reading data in and out at a data connection DQ of the integrated semiconductor memory device. In this case, the control signals are applied in sync with the waveform of a control clock which is formed from the clock signals CLK and bCLK.

To perform a write access operation to one of the memory cells SZ, which is able to be selected by applying the address AD at the external connection E of the address register 300, an activation signal ACT is applied to the integrated semiconductor memory device during a first clock period 1. The activation signal ACT is formed from a signal combination of the control signals /CS and /RAS. Following evaluation of the activation signal ACT, the selection transistors AT in the memory cells which are arranged along the word line selected using the address AD are turned on. To select a memory cell along the word line WL, the signal combination WRITE, which is formed from the control signals /CS, /CAS and /WE, is applied to the external connections of the integrated semiconductor memory device within a clock period 2. When the appropriate address AD is used to select the memory cell SZ1, for example, the bit line BL1 is connected to the data connection DQ via a sense amplifier (not shown in FIG. 1). Within a clock period 3, a data item which is present at the data connection DQ is read into the memory cell SZ1.

The clock periods 6, 7 and 8 show the waveform of the external control signals during read access to one of the memory cells. To assess a potential level on the bit lines, these are charged to a common precharge potential within the clock period 6 by the signal combination PRE, which is formed from the control signals /CS, /RAS and /WE. During the clock period 7, in similar fashion to write access, the activation signal ACT, which is formed from the control signal /CS and /RAS, is again applied to the external connections of the integrated semiconductor memory device. As a result of the activation signal ACT, a word line is activated along which the selection transistors in the memory cells are turned on. To select one of the memory cells which are arranged along the word line WL, the signal combination READ, which is formed from the control signal /CS and /CAS, is applied to the integrated semiconductor memory device within a clock period 8 for read access. In line with the applied address, the control circuit 200 then selects a memory cell along the selected word line for read access.

As FIG. 2 shows, the control signal combinations ACT, WRITE, PRE and READ are always applied within one clock period of the control clock. The control clock is formed from a clock signal CLK and a clock signal bCLK, whose waveform is complementary to that of the clock signal CLK. At every second crossover point for the clock signals with complementary waveforms, a new clock period starts. To operate the integrated semiconductor memory device in sync with the waveform of the control clock, the two clock signals CLK and bCLK need to assume a high and a low level in complementary fashion with respect to one another. If one of the clock signals does not assume the full high or low level or even an approximately static value, this may result in a shift in the crossover points for the two clock signals. Level fluctuations in the clock signals CLK and bCLK have a particularly problematic effect. Such level fluctuations lengthen or shorten the times for applying the command signals ACT, WRITE, PRE and READ. There is thus the disturbance in the errorfree reading of data into and out of a memory cell array in an integrated semiconductor memory device.

SUMMARY

An object of the present invention is to provide an integrated circuit that can be used to analyze the waveform of a signal.

It is another object of the present invention to provide a method that analyzes the waveform of a signal.

The aforesaid objects are achieved individually and/or in combination, and it is not intended that the present invention be construed as requiring two or more of the objects to be combined unless expressly required by the claims attached hereto.

In accordance with a first embodiment of the present invention, an integrated circuit that can be used to analyze the waveform of a signal comprises a connection to apply a first input signal, which assumes a first state and a second state during a signal period, a connection to apply a second input signal, a first storage circuit to store a state for the second input signal and a second storage circuit to store a state for the second input signal. The input of the first storage circuit is connected to the connection that applies the second input signal. The input of the second storage circuit is connected to the connection that applies the second input signal. The first storage circuit is designed such that the state of the second input signal which is supplied to the input of the first storage circuit is stored in the first storage circuit when the first input signal assumes the first state during the signal period of the first input signal. The second storage circuit is designed such that the state of the second input signal which is supplied to the input of the second storage circuit is stored in the second storage circuit when the first input signal assumes the second state during the signal period of the first input signal.

The integrated semiconductor memory device also comprises an evaluation circuit that generates or produces an evaluation signal. The evaluation circuit is supplied with the state of the second input signal which is stored in the first storage circuit and with the state of the second input signal which is stored in the second storage circuit. The evaluation circuit is designed such that its output produces the evaluation signal with a first state when the state of the second input signal which is stored in the first storage circuit differs from the state of the second input signal which is stored in the second storage circuit. In addition, the evaluation circuit is designed such that its output produces the evaluation signal with a second state when the state of the second input signal which is stored in the first storage circuit matches the state of the second input signal which is stored in the second storage circuit.

The first storage circuit comprises a first storage unit and at least one further storage unit which are each able to store a state for the second input signal. The second storage circuit comprises a first storage unit and at least one further storage unit which are each able to store a state for the second input signal. The input of the first storage unit in the first storage circuit is connected to the connection that applies the second input signal. The further storage unit in the first storage circuit can be supplied with the state of the second input signal which is stored in the first storage unit in the first storage circuit in order to store it. The input of the first storage unit in the second storage circuit is connected to the connection that applies the second input signal. The further storage unit in the second storage circuit can be supplied with the state of the second input signal which is stored in the first storage unit in the second storage circuit in order to store it. The first storage unit and the further storage unit in the first storage circuit are designed such that the state of the second input signal which is supplied to the input of the first storage unit in the first storage circuit is stored in the first storage unit in the first storage circuit and the state of the second input signal which is supplied to the input of the further storage unit in the first storage circuit is stored in the further storage unit in the first storage circuit and subsequently the output of the first storage unit in the first storage circuit produces the state stored therein and the output of the further storage unit in the first storage circuit produces the state stored therein when the first input signal assumes the first state during the signal period of the first input signal. In addition, the first storage unit and the further storage unit in the second storage circuit are designed such that the state of the second input signal which is supplied to the input of the first storage unit in the second storage circuit is stored in the first storage unit in the second storage circuit and the state of the second input signal which is supplied to the input of the further storage unit in the second storage circuit is stored in the further storage unit in the second storage circuit and subsequently the output of the first storage unit in the second storage circuit produces the state stored therein and the output of the further storage unit in the second storage circuit produces the state stored therein when the first input signal assumes the second state during the signal period of the first input signal.

In an embodiment of the integrated circuit of the present invention, the first storage unit and the further storage unit in the first storage circuit are connected as a shift register. In addition, the first storage unit and the further storage unit in the second storage circuit are connected as a shift register.

In accordance with another embodiment of the present invention, the integrated circuit includes a control circuit to control the first storage circuit and the second storage circuit with an input connection to apply an input signal and an output connection to generate or produce a first control signal and an output connection to generate or produce a second control signal. The control circuit is designed such that it produces the first and second control signals from the first input signal, with the first control signal being produced with a time delay relative to a falling edge of the first input signal with a first state, and the second control signal being produced with a time delay relative to the falling edge of the first input signal with a second state. In addition, the control circuit is designed such that it produces the first and second control signals from the first input signal, with the first control signal being produced with a time delay relative to a rising edge of the first input signal with the second state, and the second control signal being produced with a time delay relative to the rising edge of the first input signal with the first state.

In a further embodiment of the integrated circuit of the present invention, the first storage units and the further storage units in the first and second storage circuits can each be actuated by the first control signal and the second control signal. The first storage unit and the further storage unit in the first storage circuit are designed such that the state of the second input signal which is supplied to the input of the first storage unit in the first storage circuit is stored in the first storage unit in the first storage circuit and the state of the second input signal which is supplied to the input of the further storage unit in the first storage circuit is stored in the further storage unit in the first storage circuit when the first control signal assumes the first state, and the state of the second input signal which is stored in the first storage unit in the first storage circuit is produced by the output of the first storage unit in the first storage circuit and the state of the second input signal which is stored in the further storage unit in the first storage circuit is produced by the output of the further storage unit in the first storage circuit when the second control signal assumes the first state. In addition, the first storage unit and the further storage unit in the second storage circuit are designed such that the state of the second input signal which is supplied to the input of the first storage unit in the second storage circuit is stored in the first storage unit in the second storage circuit and the state of the second input signal which is supplied to the further storage unit in the second storage circuit is stored in the further storage unit in the second storage circuit when the first control signal assumes the second state, and the state of the second input signal which is stored in the first storage unit in the second storage circuit is produced by the output of the first storage unit in the second storage circuit and the state of the second input signal which is stored in the further storage unit in the second storage circuit is produced by the output of the further storage unit in the second storage circuit when the second control signal assumes the second state.

In still another embodiment of the integrated circuit of the present invention, the evaluation circuit is designed such that its output connection produces the evaluation signal with the first state when the state stored in the first storage unit in the first storage circuit and the state stored in the further storage unit in the first storage circuit match and the state stored in the first storage unit in the second storage circuit and the state stored in the further storage unit in the second storage circuit match and the state stored in the further storage unit in the first storage circuit and the state stored in the further storage unit in the second storage circuit differ. Otherwise, the evaluation circuit produces the evaluation signal with the second state.

In further accordance with the present invention, a method for analyzing a waveform for an input signal in an integrated circuit comprises providing an integrated circuit including a connection to apply a first input signal, a connection to apply a second input signal, a first storage circuit to store a state for the second input signal and a second storage circuit to store a state for the second input signal. The first input signal is applied to the connection that applies the first input signal, with the first input signal effecting a first and a second state change within a signal period. Subsequently the second input signal is applied to the connection that applies the second input signal. Subsequently the first state change in the first input signal is produced in a first signal period of the first input signal. Next, a state for the second input signal is read into the first storage circuit. Subsequently the second state change in the first input signal is produced in the first signal period. Subsequently a state for the second input signal is read into the second storage circuit. Next, the state stored in the first storage circuit and the state stored in the second storage circuit are compared. An evaluation signal is then produced with a first state when the state of the second input signal which is stored in the first storage circuit and the state of the second input signal which is stored in the second storage circuit match. The evaluation signal is produced with a second state when the state of the second input signal which is stored in the first storage circuit and the state of the second input signal which is stored in the second storage circuit differ.

An embodiment of the method for analyzing a waveform for an input signal in an integrated circuit includes providing an integrated circuit in which the first storage circuit comprises at least two storage units and the second storage circuit comprises at least two storage units. The first input signal is applied to the connection that applies the first input signal, with the first input signal effecting the first and second state changes within a signal period. Subsequently the second input signal is applied to the connection that applies the second input signal. Next, the first state change in the first input signal is produced in a first signal period of the first input signal. A state for the second input signal is then read into a first of the storage units in the first storage circuit. The second state change in the first input signal is then produced in the first signal period. Subsequently a state for the second input signal is read into a first of the storage units in the second storage circuit. Next, the first state change in the first input signal is applied in a second signal period of the first input signal, which follows the first signal period. The state of the second input signal which is stored in the first of the storage units in the first storage circuit is then read into a further of the storage units in the first storage circuit. Subsequently a state for the second input signal is read into the first of the storage units in the first storage circuit. Subsequently to this the second state change in the first input signal is produced in the second signal period. Subsequently the state of the second input signal which is stored in the first of the storage units in the second storage circuit is read into a further of the storage units in the second storage circuit. Next, a state for the second input signal is read into the first of the storage units in the second storage circuit. The state stored in the first of the storage units and the state stored in the further of the storage units in the first storage circuit are then compared. Subsequently the state stored in the first of the storage units and the state stored in the further of the storage units in the second storage circuit are compared. Next, the state stored in the further of the storage units in the first storage circuit and the state stored in the further of the storage units in the second storage circuit are compared. Finally, the evaluation signal is produced with the first state when the state stored in the first of the storage units and the state stored in the further of the storage units in the first storage circuit match and when the state stored in the first of the storage units and the state stored in the further of the storage units in the second storage circuit match and when the state stored in the further of the storage units in the first storage circuit and the state stored in the further of the storage units in the second storage circuit differ. In all other cases, the evaluation signal is produced with the second state.

A further embodiment of an integrated circuit for analyzing the waveform of a signal comprises a comparison device with a first input connection to apply an input signal and with a second input connection to apply a reference signal and with an output connection to generate or produce an evaluation signal. The integrated circuit also comprises an evaluation circuit with an output connection to generate or produce a control signal. It additionally has a controllable current generator with an output connection to generate or produce an output voltage. The comparison device is designed such that it produces a level for a first comparison signal and a level for a second comparison signal from the reference signal. In addition, the comparison device is designed such that it produces the evaluation signal on the basis of a comparison between a level for the input signal and the level of the first comparison signal and the level of the second comparison signal. The evaluation circuit is actuated by the evaluation signal and is designed such that it produces the control signal at the output on the basis of a state of the evaluation signal. The controllable current generator is actuated by the control signal. The controllable current generator is designed such that its output connection produces a level for the output voltage on the basis of the control signal.

In another embodiment of the integrated circuit of the invention, the controllable current generator comprises a first controllable current source with a control connection and a second controllable current source with a control connection. The first controllable current source is connected between a connection to apply a supply voltage and the output connection of the controllable current generator. The second controllable current source is connected between the output connection of the controllable current generator and a connection to apply a reference voltage. The control connection of the first controllable current source is actuated by the control signal produced by the evaluation circuit. The control connection of the second controllable current source is actuated in inverted form by the control signal produced by the evaluation circuit.

In an embodiment of the integrated circuit, the first controllable current source includes a first field effect transistor of a first conductivity type and the second controllable current source includes a second field effect transistor of a second conductivity type. The first field effect transistor and the second field effect transistor are actuated by the control signal. The connection that applies the supply voltage can be connected via the first field effect transistor to the output connection of the controllable current generator. In addition, the connection that applies the reference voltage can be connected via the second field effect transistor to the output connection of the controllable current generator.

In another embodiment of the integrated circuit of the invention, the first field effect transistor and the second field effect transistor are designed such that the current flowing through the first field effect transistor when the first field effect transistor is in the conductive state is smaller than the current flowing through the second field effect transistor when the second field effect transistor is in the conductive state.

A method for analyzing a waveform for an input signal in an integrated circuit in accordance with the invention comprises providing an integrated circuit including a connection to apply an input signal and a storage capacitor to store a state of charge. A level for a first comparison signal and a level for a second comparison signal are produced. Subsequently the input signal is applied to the connection that applies the input signal. During a time span, a level for the input signal is compared with the level of the first comparison signal and with the level of the second comparison signal. Subsequently a first charging current that stores the storage capacitor is produced during a time interval in the time span during which the level of the input signal is between the level of the first comparison signal and the level of the second comparison signal. During a time interval in the time span during which the level of the input signal is above the level of the first comparison signal or below the level of the second comparison signal, a second charging current to discharge the storage capacitor is produced. The end of the time span is followed by reading an output voltage, to which the storage capacitor has been charged as a result of the first or second charging current.

The above and still further objects, features and advantages of the present invention will become apparent upon consideration of the following detailed description of specific embodiments thereof, particularly when taken in conjunction with the accompanying drawings where like numerals designate like components.

DETAILED DESCRIPTION

Figure 3:
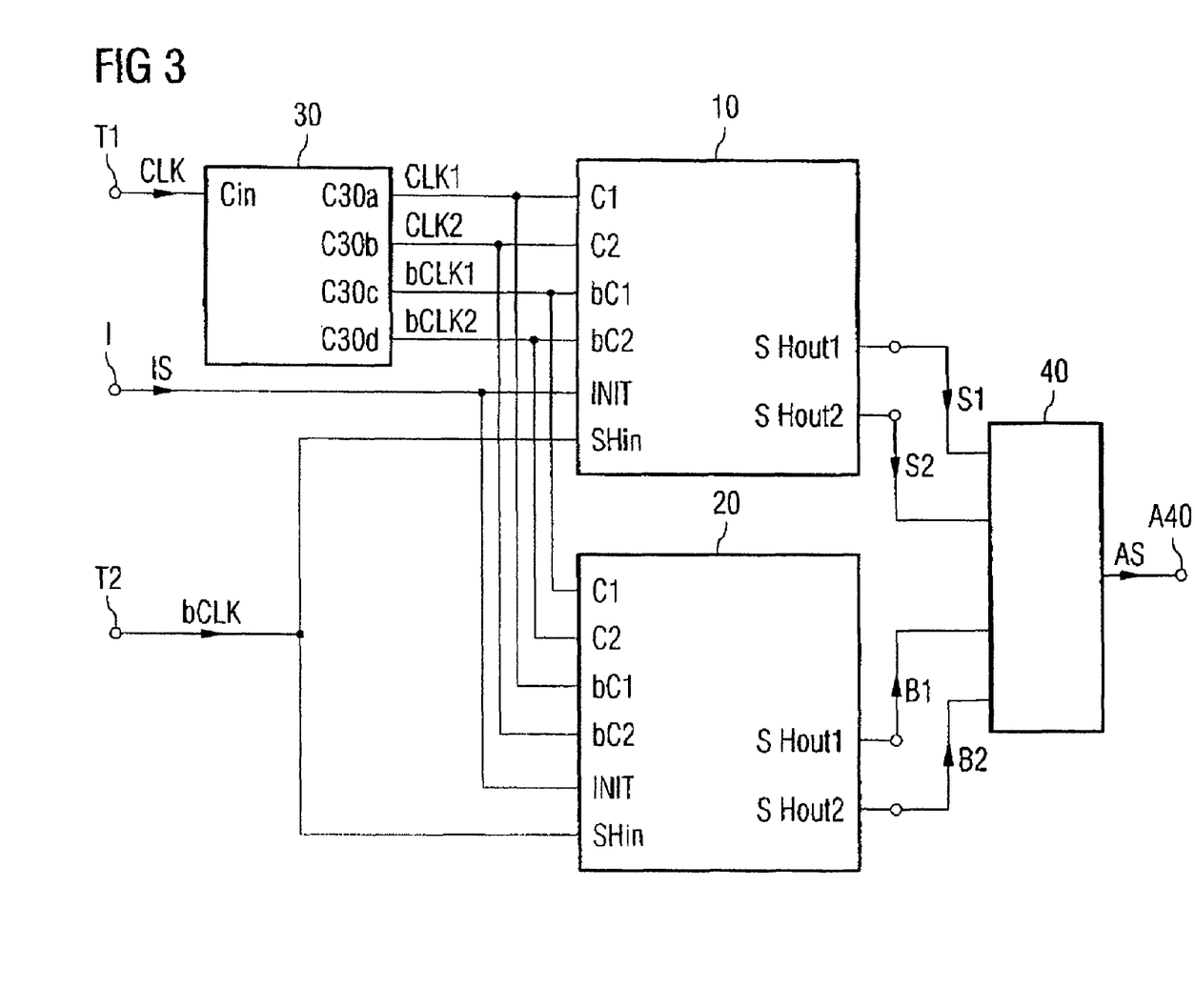
FIG. 3 depicts a first embodiment of an integrated circuit for analyzing the waveform of a signal in accordance with the present invention.

FIG. 3 shows an integrated circuit with a storage circuit 10, a storage circuit 20, a control circuit 30 and an evaluator circuit 40. The control circuit 30 is actuated at a clock connection T1 by a clock signal CLK. Deriving them from the clock signal CLK, it produces the control signal CLK1 at an output connection C30a, the control signal CLK2 at an output connection C30b, the control signal bCLK1 at an output connection C30c, and the control signal bCLK2 at an output connection C30d, the control signals being used to actuate the storage circuits 10 and 20.

The storage circuits 10 and 20 are of identical design. The storage unit 10 is supplied with the control signal CLK1 at a control input C1, with the control signal CLK2 at a control input C2, with the control signal bCLK1 at a control input bC1 and with the control signal bCLK2 at a control input bC2. The storage circuit 20 is actuated at its control input C1 by the control signal bCLK1, at its control input C2 by the control signal bCLK2, at its control input bC1 by the control signal CLK1 and at its control input bC2 by the control signal CLK2. In addition, the storage circuits 10 and 20 have a connection INIT which is connected to a connection I for applying an initialization signal IS.

At a clock connection T2 there is a clock signal bCLK which is supplied to a respective connection SHin of the storage circuits 10 and 20. The storage circuit 10 produces a state signal S1 at an output connection SHout1 and a state signal S2 at an output connection SHout2. The two state signals S1 and S2 respectively indicate the storage state of a storage unit in the storage circuit 10 and are supplied to the input of the evaluation circuit 40. The storage circuit 20 produces the state signal B1 at an output connection SHout1 and the state signal B2 at an output connection SHout2. The state signals B1 and B2 respectively indicate the state of a storage unit in the storage circuit 20 and are supplied to the input of the evaluation circuit 40. The evaluation circuit 40 evaluates the state signals S1, S2 and B1, B2 supplied to its input and produces an evaluation signal AS at an output connection A40 on the basis of the evaluation of the state signals.

Figure 4:
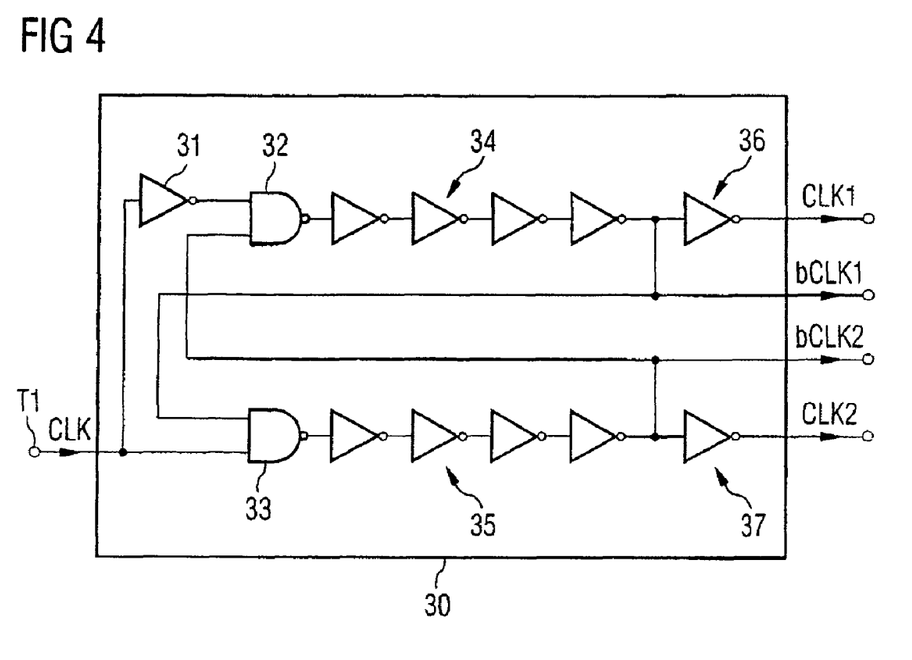
FIG. 4 depicts an embodiment of a control circuit for controlling the integrated circuit in accordance with the present invention.

FIG. 4 shows an embodiment of the control circuit 30 for producing the control signals CLK1, CLK2, bCLK1 and bCLK2. The control circuit 30 includes a multivibrator comprising a NAND gate 32 and a NAND gate 33. The output signals produced at the output of the NAND gates 32 and 33 are delayed by inverter chains 34 and 35. The delayed output signal from the NAND gate 32 is supplied to the input of the NAND gate 33. The delayed output signal from the NAND gate 33 is supplied to the input of the NAND gate 32. The input of the NAND gate 33 is also connected to the clock connection T1 for applying the clock signal CLK. The NAND gate 32 is supplied with the clock signal CLK in inverted form via the inverter 31. Having been delayed by the inverter chain 34, the output signal from the NAND gate 32 is inverted by an inverter 36 and is output as a control signal CLK1. The control signal bCLK1 corresponds to the uninverted control signal CLK1, which is output directly downstream of the inverter chain 34. Having been delayed by the inverter chain 35, the output signal from the NAND gate 33 is inverted by an inverter 37 and is output as a control signal CLK2. The uninverted control signal CLK2 is output directly downstream of the inverter chain 35 as control signal bCLK2.

The control circuit 30 thus takes the clock signal CLK and produces, at the output, the control signals CLK1, bCLK1, CLK2 and bCLK2, which have a time delay with respect to the clock signal CLK. The control signal bCLK1 has a complementary waveform relative to the control signal CLK1. Similarly, the waveform of the control signal bCLK2 is complementary to that of the control signal CLK2. In addition, the control signals CLK1 and CLK2 and also the control signals bCLK1 and bCLK2 behave in complementary fashion to one another.

Figure 5:
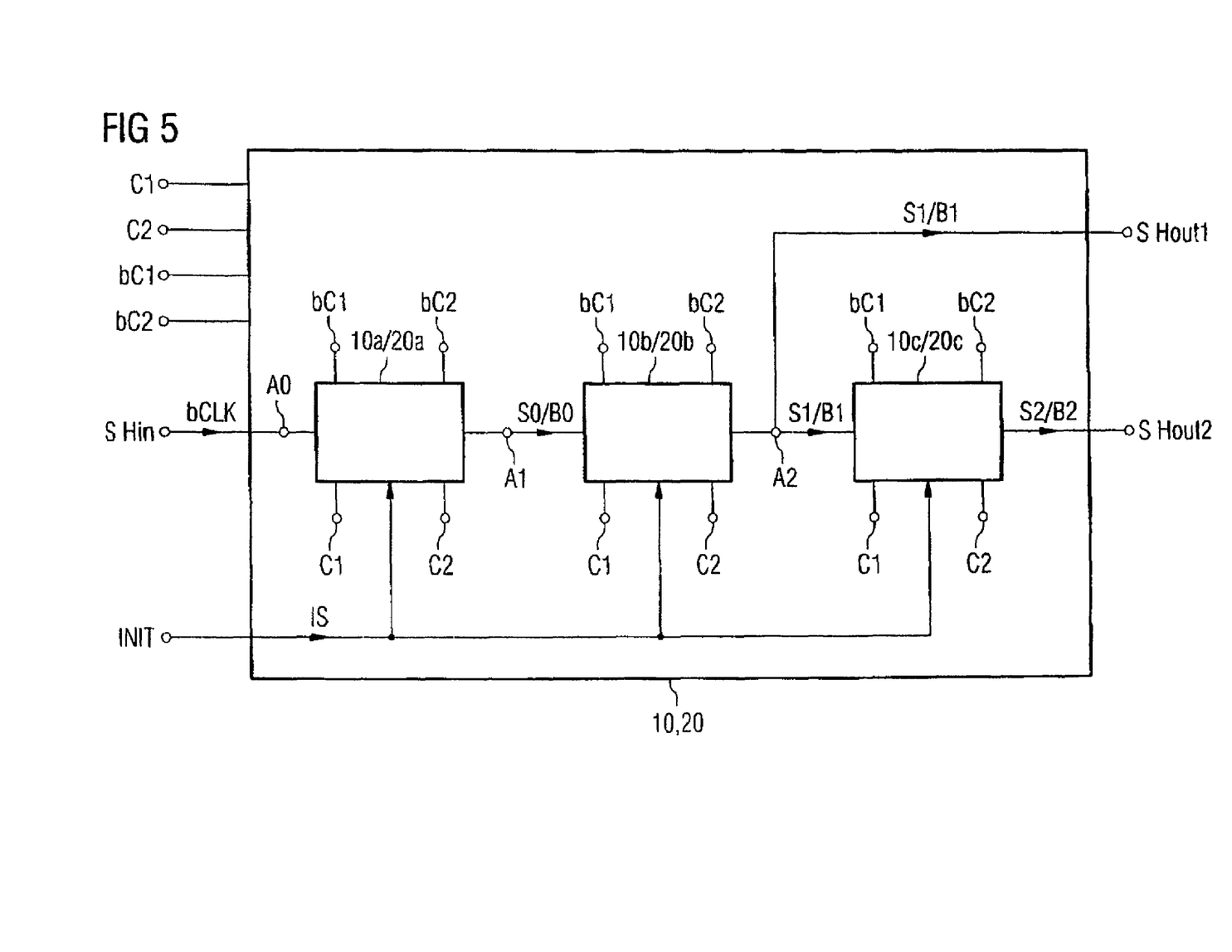
FIG. 5 depicts an embodiment of a shift register for storing signal states in accordance with the present invention.

FIG. 5 shows the circuit design of the storage circuits 10 and 20. The storage circuits 10 and 20 each include three storage units 10a, 10b and 10c and 20a, 20b and 20c, respectively. Each of the storage units includes a control connection C1, bC1, C2 and bC2. The control connection C1 of each of the storage units 10a, 10b and 10c and 20a, 20b and 20c is connected to the control connection C1 of the associated storage circuit. The control connection C2 of each of the storage units in a storage circuit is connected to the control connection C2 of the associated storage unit. The control connection bC1 of each of the storage units in a storage circuit is connected to the control connection bC1 of the associated storage circuit. The control connection bC2 of each of the storage units in a storage circuit is connected to the control connection bC2 of the associated storage circuit.

The storage unit 10a in the storage circuit 10 is connected by its input connection A0 to the input connection SHin of the storage circuit 10, and, at the output, is connected by its output connection A1 to the storage unit 10b. The storage unit 10b is connected by its output connection A2 to the storage unit 10c. The output of the storage unit 10a produces a state signal S0 which is supplied to the storage unit 10b. The output of the storage unit 10b produces a state signal S1 which is supplied to the storage unit 10c and to the output connection SHout1 of the storage circuit 10. The output of the storage unit 10c produces the state signal S2, which it supplies to the output connection SHout2.

Within the storage circuit 20, the storage units 20a, 20b and 20c are, as described using the example of the storage circuit 10, likewise connected in series with one another by their output connections A1 and A2. The output of the storage unit 20a produces a state signal B0 which is supplied to the storage unit 20b. The output of the storage unit 20b produces a state signal B1 which is supplied to the storage unit 20c and to the output connection SHout1. The output of the storage unit 20c produces a state signal B2 which it supplies to the output connection SHout2.

The storage units 10a, 10b and 10c and also the storage units 20a, 20b and 20c can be initialized with a state for the clock signal CLK by an initialization signal IS, which is applied to the initialization connection of the respective storage circuit.

Figure 6:
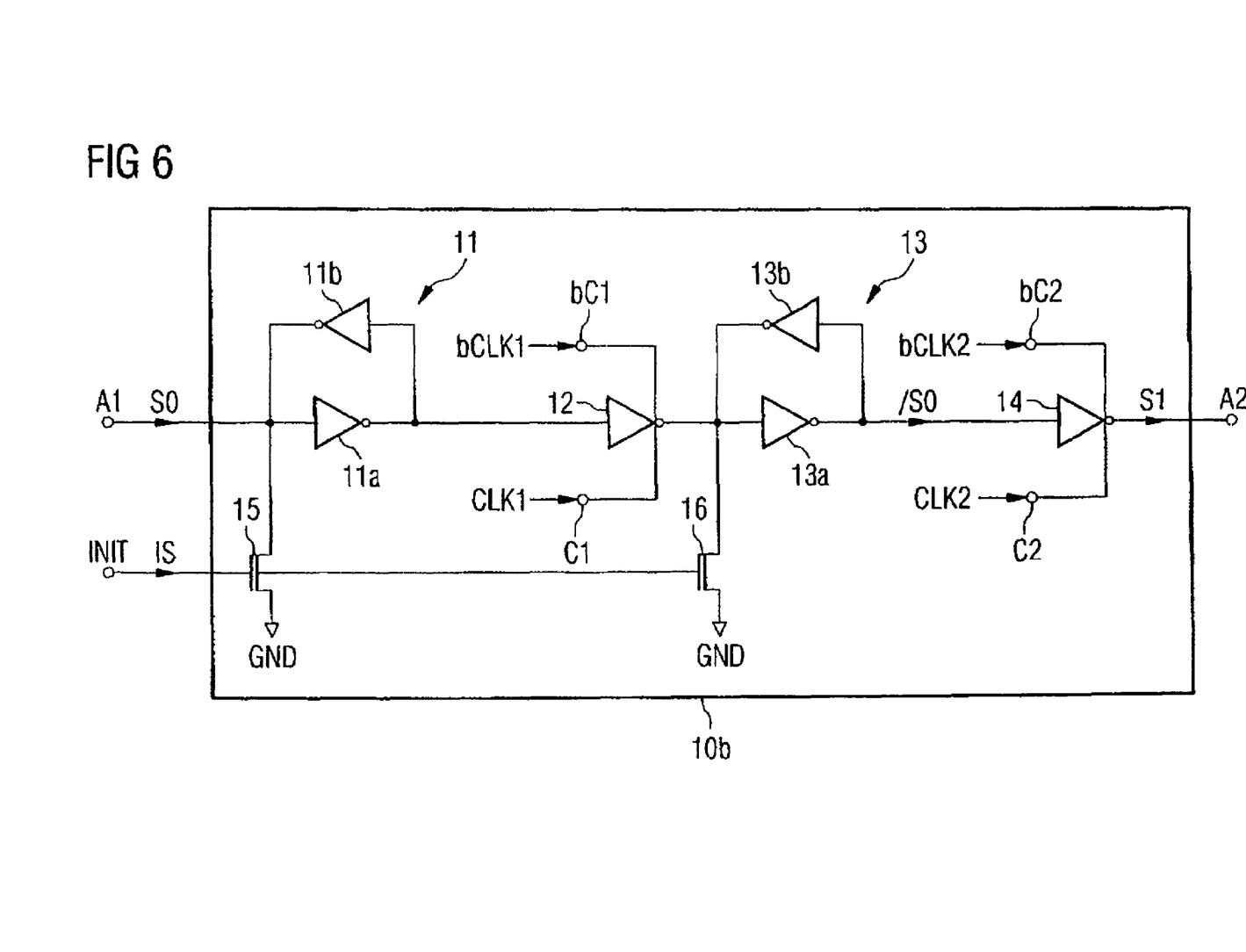
FIG. 6 depicts an embodiment of a storage unit in a shift register for storing a signal state in accordance with the present invention.

FIG. 6 shows the internal circuit structure of the storage unit 10b. The other storage units 10a and 10c in the storage circuit 10 and also the storage units 20a, 20b and 20c in the storage circuit 20 are of identical design to the storage unit 10a. The storage unit 10b has two inverters 11a and 11b in a feedback inverter circuit 11 and two inverters 13a and 13b in a feedback inverter circuit 13. The input of the feedback inverter circuit 11 is connected to the output connection A1 of the storage unit 10a, so that the latter supplies it with the state signal S0. The feedback inverter circuit 11 is connected to the feedback inverter circuit 13 via an activatable inverter 12, known as a tristate inverter. The feedback inverter circuit 13 is connected via a further activatable inverter 14 to the output connection A2 of the storage unit 10c, which output connection is supplied with the state signal S1. The storage unit also has switching transistors 15 and 16. A control connection of the switching transistors 15 and 16 is connected to the initialization connection INIT of the associated storage circuit. When the initialization signal IS is applied, the switching transistors 15 and 16 are turned on and the potential at the input of the inverters 11a and 13a is pulled to the level of the reference voltage GND.

As described at the outset, the control signals CLK1 and CLK2 and also the control signals bCLK1 and bCLK2 behave in complementary fashion to one another. If, by way of example, the control signal CLK1 assumes a low level and accordingly the control signal bCLK1 assumes a high level, the control signal CLK2 assumes a high level and the control signal bCLK2 assumes a low level. In this case, the tristate inverter 12 has a low impedance, whereas the tristate inverter 14 has a high impedance behavior.

The state signal produced at the output connection A1 of the storage unit 10a is in this case inverted by the feedback inverter circuit 11, is likewise inverted by the tristate inverter 12 and is inverted again by the feedback inverter circuit 13, assuming that the switching transistors 15 and 16 are off. The output of the inverter 13a thus produces a state signal /S0 which is inverted relative to the state signal S0. To this end, the control signals CLK1, CLK2, bCLK1 and bCLK2 need to be delayed by the control circuit 30 such that their delay relative to the clock signal bCLK corresponds at least to a setup time for the storage units in the storage circuits. In this context, the setup time is the time span which is required for the state of the clock signal bCLK to be present downstream of the feedback inverter 13.

If the control signal CLK1 assumes a low level and the control signal bCLK1 assumes a high level, and accordingly the control signal CLK2 assumes the high level and the control signal bCLK2 assumes the low level, then the tristate inverter 12 has a high impedance behavior, whereas the tristate inverter 14 is controlled to low impedance. In this case, the state signal /S0 which has been read into the storage unit 10b beforehand is inverted again by the tristate inverter 14 and is supplied to the output connection A2 of the storage unit 10b as a state signal S1.

As FIG. 3 shows, in the storage circuit 10 the control connection C1 is actuated by the control signal CLK1, the control connection C2 is actuated by the control signal CLK2, the control connection bC1 is actuated by the control signal bCLK1 and the control connection bC2 is actuated by the control signal bCLK2. In contrast to this, in the storage circuit 20 the control connection C1 is actuated by the control signal bCLK1, the control connection C2 is actuated by the control signal bCLK2, the control connection bC1 is actuated by the control signal CLK1 and the control connection bC2 is actuated by the control signal CLK2. This means that the storage circuits 10 and 20 behave in complementary fashion to one another in terms of reading in and forwarding the clock signal bCLK which is supplied to them via their input connection SHin. When the clock signal bCLK assumes a first and a second state in complementary fashion to the clock signal CLK, for example, the storage circuits 10 and 20 are actuated by the control signals CLK1, CLK2, bCLK1 and bCLK2 such that the storage units 10a, 10b and 10c in the storage circuit 10 are used to store the first of the two states of the clock signal bCLK and the storage units 20a, 20b and 20c in the storage circuit 20 are used to store the second state of the second clock signal bCLK.

Figure 7:
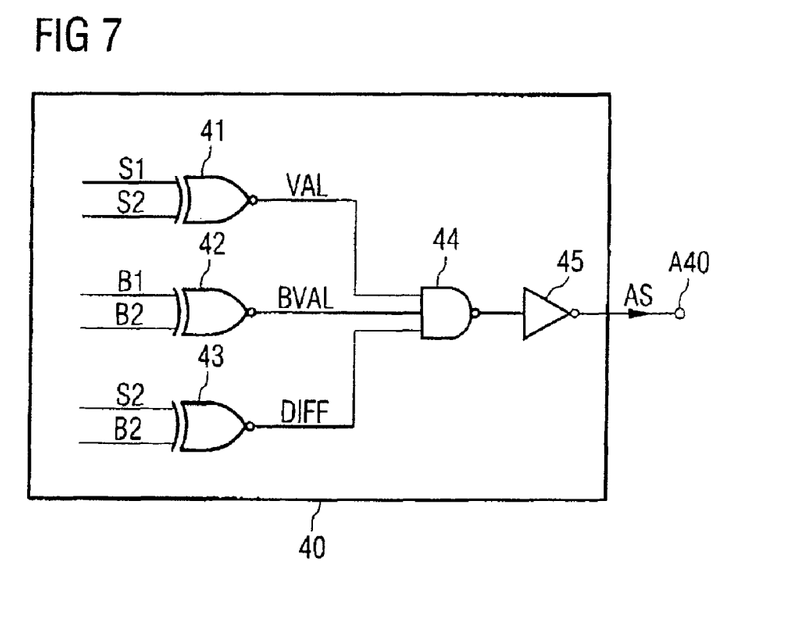
FIG. 7 depicts an evaluation circuit for evaluating storage states in accordance with the present invention.

FIG. 7 shows the internal structure of the evaluation circuit 40. The evaluation circuit 40 includes an XNOR gate 41, whose input is supplied with the state signal S1 stored in the storage unit 10b and with the state signal S2 stored in the storage unit 10c. The output of the XNOR gate 41 produces a signal VAL which is supplied to a NAND gate 44. In addition, the evaluation circuit 40 comprises an XNOR gate 42 whose input is supplied with the state signal B1 from the storage unit 20b and with the state signal B2 from the storage unit 20c. The output of the XNOR gate 42 produces the signal BVAL, which is supplied to the input of the NAND gate 44. In addition, the evaluation circuit 40 comprises an XOR gate 43 whose input is supplied with the state signal S2 from the storage unit 10c and with the state signal B2 from the storage unit 20c. The output of the XOR gate 43 produces the signal DIFF, which is supplied to the input of the NAND gate 44. The output of the NAND gate 44 is connected to an output connection A40 of the evaluation circuit 40 via an inverter 45. Following evaluation of the state signals S1, S2, B1 and B2, the output connection A40 of the evaluation circuit produces the evaluation signal AS.

Figure 8:
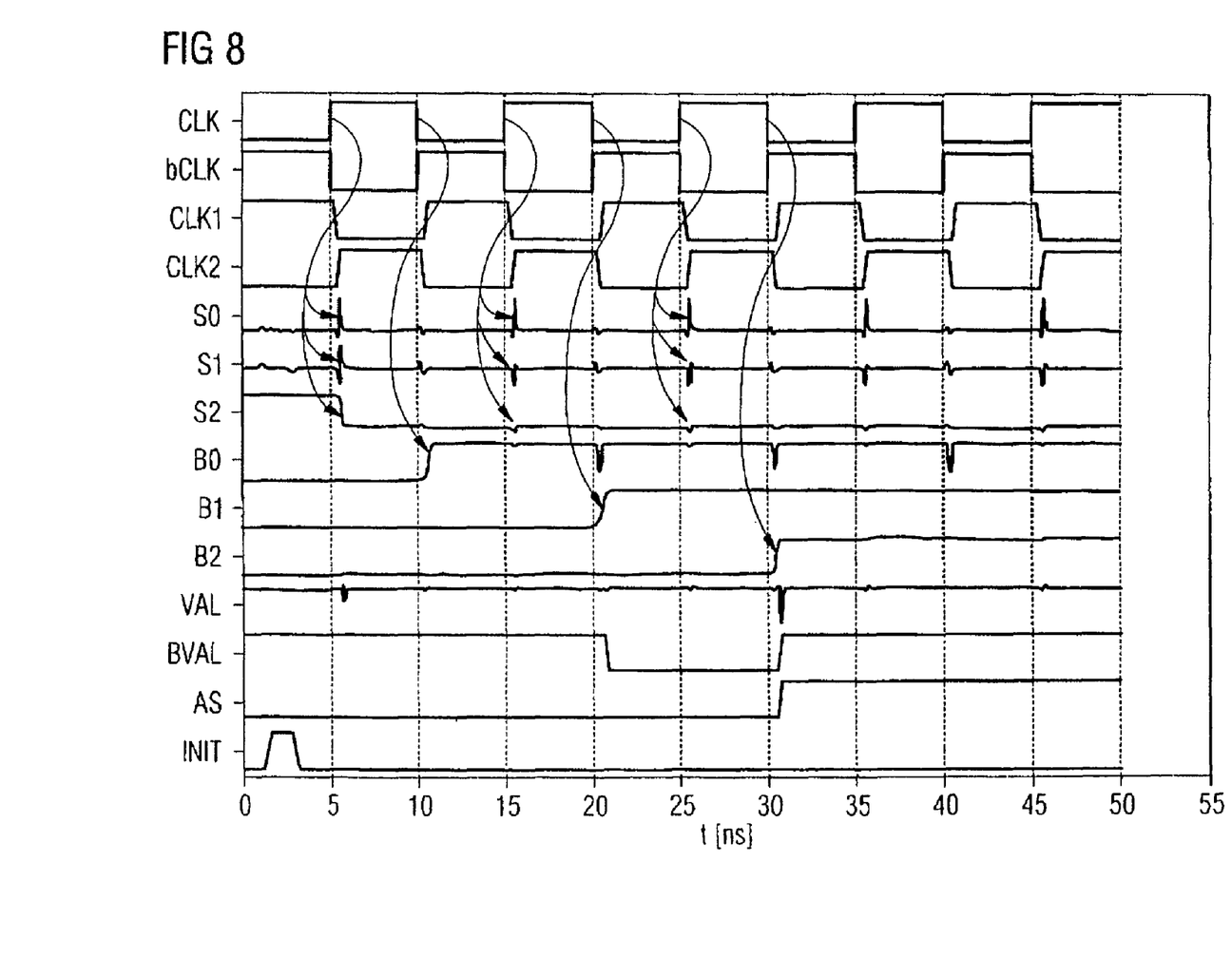
FIG. 8 depicts a signal state diagram for an integrated circuit for analyzing the waveform of a signal in accordance with the present invention.

The way in which the circuit for analyzing the clock signal bCLK works is explained below with reference to FIG. 8. FIG. 8 shows the first clock signal CLK and the second clock signal BCLK, whose waveform is complementary to that of the first clock signal. As explained, the control signals CLK1 and bCLK1 and also the control signals CLK2 and bCLK2 are derived from the clock signal CLK by the control circuit 30. For this, FIG. 8 shows only the waveform of the control signals CLK1 and CLK2. As a result of the inverter chains 34 and 35 in the control circuit 30, the waveforms of the control signals CLK1 and CLK2 and of their complementary signals bCLK1 and bCLK2 are delayed in time relative to that of the first clock signal CLK. In addition, the state signals S0, S1 and S2 in the storage circuit 10 and the state signals B0, B1 and B2 in the storage circuit 20 are shown. FIG. 8 also shows the waveform of the signal VAL, of the signal BVAL and of the evaluation signal AS from the evaluation circuit 40.

At time t=2.5 ns, the initialization signal INIT is applied to the initialization connection of the storage circuits 10 and 20. The feedback inverter circuits in the storage units 10a, 10b and 10c and also in the storage units 20a, 20b and 20c are thus pulled to the level of the reference voltage GND.

The rising clock edge of the first clock signal CLK at time t=5 ns results, after a time delay, in a falling edge of the first control signal CLK1 derived from the first clock signal and in a rising edge of the control signal CLK2 derived from the first clock signal. When the first control signal CLK1 assumes the high level, a state for the signal applied to the input connections A0, A1 and A2 is respectively read into the storage units 10a, 10b and 10c. The activatable inverter 12 now has a low impedance and the activatable inverter 14 is controlled to a high impedance. Since the falling edge of the control clock CLK1 is delayed in time relative to the first and second clock signals, a low potential level (corresponding to the logic state "0") for the clock signal bCLK is read into the storage unit 10a shortly after the time t=5 ns, since the control signal CLK1 is still at the high level at this time.

The falling edge of the control signal CLK1 or the rising edge of the control signal CLK2 results in the state of the clock signal bCLK which has been read into the storage unit 10a being read. If the waveform of the second clock signal bCLK is complementary to that of the first clock signal CLK, the storage state of the storage units 10a, 10b and 10c is thus read with a slight time delay relative to the rising edge of the clock signal CLK. The activatable inverter 12 is now at high impedance and the activatable inverter 14 is controlled to low impedance. After three clock periods of the first clock signal CLK, all the storage units in the storage circuit 10 store the logic signal state "0" if the waveform of the clock signal bCLK is complementary to that of the clock signal CLK, as shown in FIG. 8.

By contrast, a falling edge of the first clock signal CLK produces a rising edge of the control signal CLK1 and a falling edge of the control signal CLK2 after a time delay caused by the control circuit 30. When the control signal CLK1 has assumed a low level and the control signal CLK2 has assumed a high level, the state of the clock signal bCLK which is applied to the input connection A0 at this time is read into the storage unit 20a. The activatable inverter 12 in the storage unit 20a is now at low impedance and the activatable inverter 14 is controlled to a high impedance. The cause of this complementary control behavior of the storage unit 20a relative to the storage unit 10a is the transposition of the control inputs C1, C2, bC1 and bC2 of the storage circuits 10 and 20 and the output connections C30a, C30b, C30c and C30d of the control circuit 30. The rising edge of the control signal CLK1 and the falling edge of the control signal CLK2 prompt the state stored in the storage units 20a, 20b and 20c to be read.

Since the waveforms of the rising edge of the control signal CLK1 and the falling edge of the control signal CLK2 are delayed in time relative to that of the clock signal bCLK, the high level (corresponding to the logic signal state "1") of the clock signal bCLK is read into the storage units in the storage circuit 20, since the control signal CLK1 is still at the low level shortly after the falling edge of the clock signal CLK.

With a slight time delay relative to a falling edge of the first clock signal CLK, the respectively stored signal state of the second clock signal bCLK is read at the output connections of the storage units 20a, 20b and 20c. When the waveform of the second clock signal is complementary to that of the first clock signal, as shown in FIG. 8, the three storage units store the signal state "1".

The XNOR gate 41 compares the storage state of the storage unit 10b and the storage state of the storage unit 10c. The XNOR gate 42 compares the storage state of the storage unit 20b and the storage state of the storage unit 20c. The XOR gate 43 compares the storage state of the storage unit 10c with the storage state of the storage unit 20c. When the storage state S1 of the storage unit 10b and the storage state S2 of the storage unit 10c match and the storage state B1 of the storage unit 20b and the storage state B2 of the storage unit 20c match and the storage state S2 and the storage state B2 differ, the evaluation circuit 40 produces the evaluation signal AS with a first state. In all other cases, the evaluation signal is produced with a second state. The first state of the evaluation signal AS is thus an indicator that the second clock signal bCLK is a signal with a periodically complementary waveform which is in sync with that of the clock signal CLK. When the evaluation signal AS is produced with the second state, on the other hand, the second clock signal has not effected a periodic state change during the clock periods under consideration. There may then be a signal with an approximately static value on the clock connection T2, for example.

It is found to be advantageous to use two storage circuits 10 and 20 in the form of shift registers, since this halves the shift clock. This requires merely that the clock inputs be connected together in complementary fashion, as shown in FIG. 3. It is naturally also possible to use a single shift register which reads in the instantaneous state of the second clock signal on the falling and rising edges of the first clock signal. In the exemplary embodiment in FIG. 5, the storage circuits 10 and 20 are in the form of shift registers which each include three storage units. To increase reliable recognition of changing states of the second clock signal, the use of relatively long shift registers is recommended. This applies primarily when the second clock signal does not exhibit digital behavior, but rather assumes a level between the logic signal state "1" and the logic signal state "0". It is advantageous for the stored state of a plurality of storage units in a storage circuit to be evaluated continuously, since in that case the storage states of the first and second storage circuits are compared over a longer period.

Figure 9:
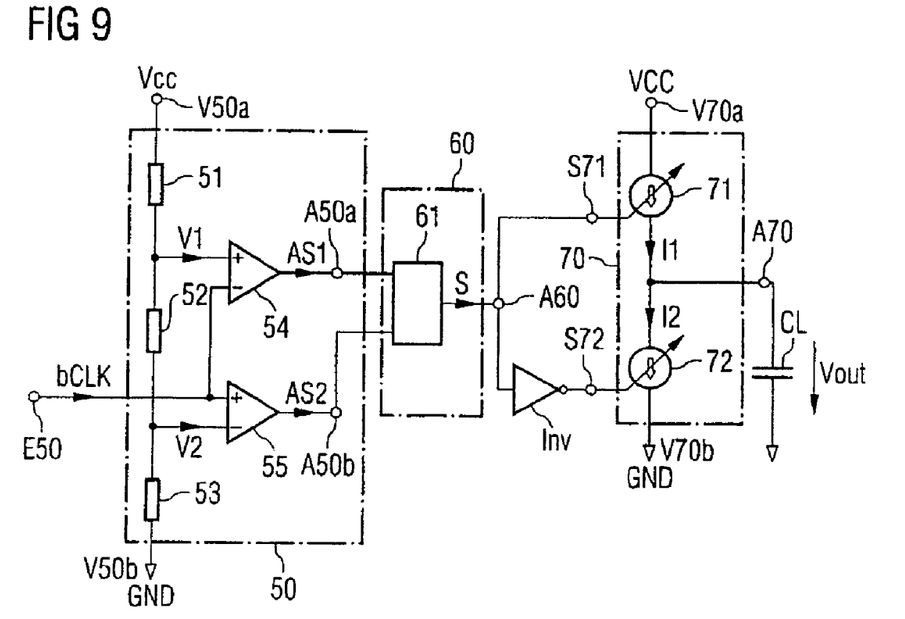
FIG. 9 depicts a second embodiment of an integrated circuit for analyzing the waveform of a signal in accordance with the present invention.

FIG. 9 shows a further embodiment of an integrated circuit for analyzing the waveform of an input signal. The circuit includes a comparison device 50 which is supplied, at an input connection E50, with the input signal bCLK which is to be analyzed. The comparison device includes a supply connection V50a to apply a supply voltage Vcc and a supply connection V50b to apply a reference voltage GND. The comparison device 50 includes a first comparator circuit 54 and a second comparator circuit 55. A resistance divider including the resistors 51, 52 and 53, which are connected between the supply connection V50a and the supply connection V50b, is used to produce reference signals V1 and V2. The first comparator circuit 54 compares the level of the input signal bCLK which is supplied to its inverting input with the level of the reference signal V1 which is supplied to its noninverting input connection. The second comparator circuit 55 compares the level of the input signal bCLK which is supplied to it at its noninverting input connection with the level of the reference signal V2 which is supplied to it at its inverting input connection. If the level of the input signal is above the level of the first reference signal VI, the comparator circuit 54 produces an evaluation signal AS1 with a low signal level at an output connection A50a. If the level of the input signal bCLK is below the level of the reference signal V2, the second comparator circuit 55 produces a low signal level at an output connection A50b. If, by contrast, the level of the input signal bCLK is less than the level of the first reference signal V1 and greater than the level of the second reference signal V2, the outputs of both comparator circuits 54 and 55 produce the evaluation signals AS1 and AS2 with a high level.

The evaluation signals AS1 and AS2 are supplied to an evaluation circuit 60. The evaluation circuit 60 includes an AND gate 61. When the evaluation signals AS1 and AS2 supplied to the AND gate 61 assume the high level (which corresponds to a logic signal state "1"), the AND gate 61 produces the control signal S with the logic high state at an output connection A60.

The control signal S is supplied to a control connection S71 of a controllable current generator 70 and, having been inverted by an inverter Inv, to a control connection S72 of the controllable current generator 70. The controllable current generator 70 includes a first controlled current source 71, which is controlled by the control signal S applied to the control connection S71. The controlled current source is connected between a supply connection V70a of the controllable current generator 70 that applies a supply voltage Vcc and an output connection A70 of the controllable current generator. In addition, the controllable current generator 70 includes a controllable current source 72 which is controlled by the inverted control signal S applied to the control connection S72. The controllable current source 72 is connected between a supply connection V70b that applies a reference voltage GND and the output connection A70 of the controllable current generator. The output connection A70 includes a storage capacitor CL connected to it.

The following describes the way in which the integrated circuit works. The comparator circuit 54 compares the level of the input signal bCLK with a level for the reference signal V1. If the level of the input signal bCLK is above the level of the reference signal V1, the comparator circuit 54 produces the evaluation signal AS1 with a low level at the output connection A50a. If, by contrast, the level of the input signal bCLK is below the level of the reference signal V1, the comparator circuit 54 produces the evaluation signal AS1 with a high level. The comparator circuit 55 compares the level of the input signal bCLK which is applied to the noninverting input connection of the comparator circuit 55 with the level of the reference signal V2 which is applied to the inverting connection of the comparator circuit 55. If the level of the input signal bCLK is below the level of the reference signal V2, the comparator circuit 55 produces the evaluation signal AS2 with a low level at the output connection A50b. If, by contrast, the level of the input signal bCLK is above the level of the reference signal V2, the comparator circuit 55 produces the evaluation signal AS2 with a high level.

The high level of the evaluation signals AS1 and AS2 corresponds to a logic high level, whereas the low level of the evaluation signals AS1 and AS2 corresponds to a logic low level. When the evaluation signal AS1 and the evaluation signal AS2 assume the logic high level, that is to say that the input signal bCLK is situated between the level of the reference signal V1 and the level of the reference signal V2, the AND gate 61 produces a high signal level for the control signal S at the output connection A60. The high signal level activates the controllable current source 71, whereas, following inversion by the inverter Inv, the controllable current source 72 is controlled to a high impedance. A charging current I1 thus charges the storage capacitor CL to an output voltage Vout.

If, by contrast, the level of the input signal bCLK is above the level of the reference signal V1 or below the level of the reference signal V2, the output connection A60 of the AND gate 61 produces the control signal S with a low level. The low level of the control signal S controls the controllable current source 71 to a high impedance, whereas, following inversion by the inverter Inv, the controllable current source 72 is controlled to a low impedance. The storage capacitor CL is thus connected to the reference voltage GND. A discharge current I2 discharges the storage capacitor CL.

A discharged storage capacitor CL indicates that the level of the input signal bCLK is either above the level of the first reference signal or below the level of the second reference signal. By contrast, a charged storage capacitor CL is an indication that the level of the input signal bCLK is between the level of the first reference signal and the level of the second reference signal.

Figure 10:
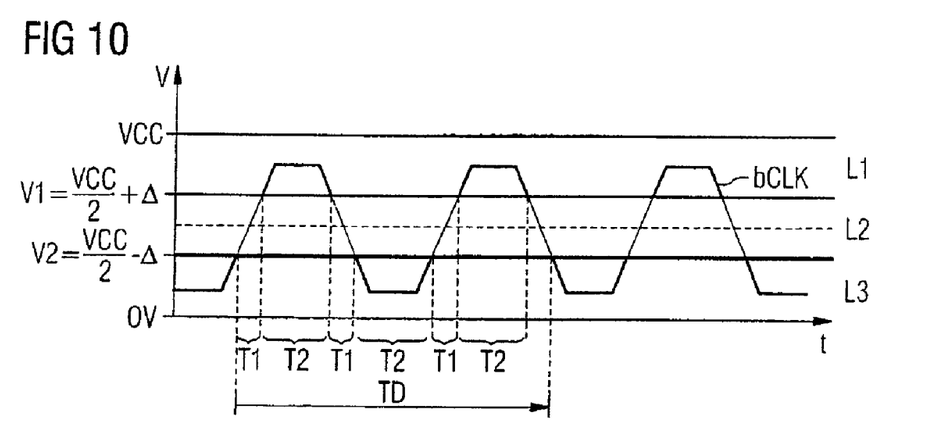
FIG. 10 depicts a waveform for an input signal in the integrated circuit in accordance with the present invention.

FIG. 10 shows the waveform of an input signal bCLK which fluctuates between the level V1=Vcc/2+Δ and the level V2=Vcc/2Δ. When the level of the input signal bCLK is in the voltage range L2 between the level of the reference signal V1 and the level of the reference signal V2, the storage capacitor is charged by the charging current I1. When, by contrast, the level of the input signal bCLK is in the range L1, above the level of the reference signal V1 or in the range L3 below the level of the reference signal V2, the current I2 discharges the storage capacitor. The comparison measurement for the levels is performed during a time span TD. As FIG. 10 shows, the input signal can fluctuate a plurality of times between the individual ranges during this time. If I2>>I1, a discharged storage capacitor indicates that the level of the input signal bCLK was above the level of the first reference signal or below the level of the second reference signal during the time span TD. If, by contrast, the storage capacitor CL has been charged to the output voltage when the time span TD has elapsed, the level of the input signal bCLK was between the level of the reference signal V1 and the level of the reference signal V2. If, by way of example, the input signal bCLK is part of a clock signal pair CLK and bCLK in an integrated semiconductor memory device, a high state of charge in the storage capacitor CL indicates that the clock signal bCLK was within the range L2 during the time span TD. The circuit thus makes it possible to establish whether an input signal was permanently connected to a voltage Vcc/2, for example.

Figure 11A:
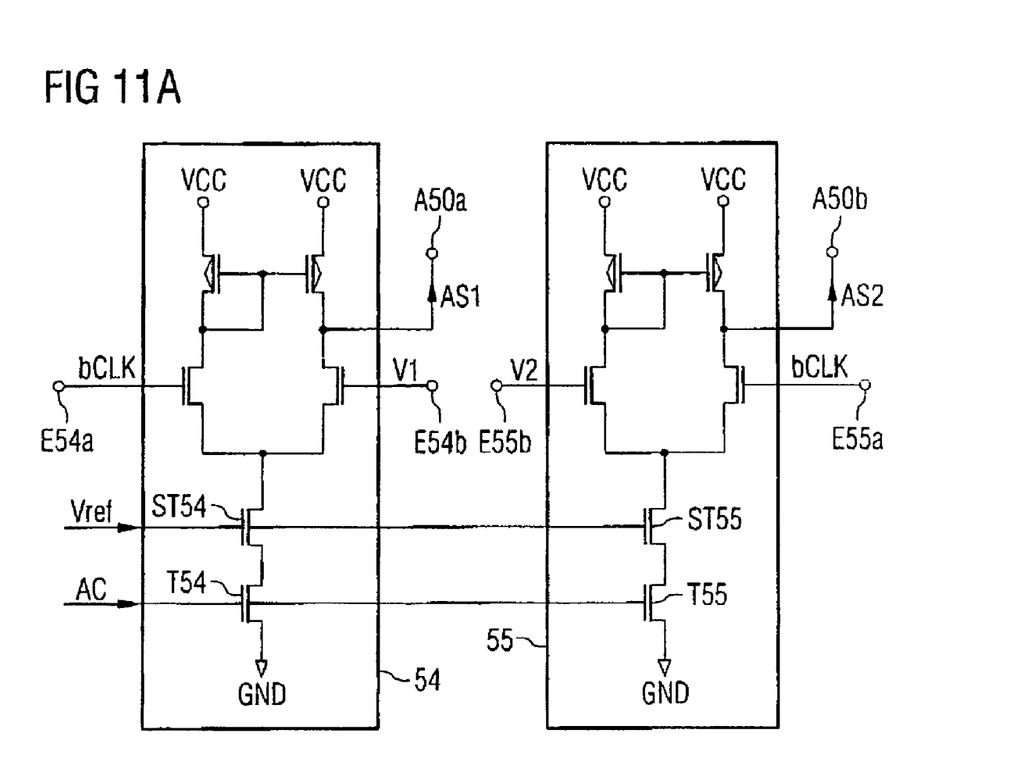
FIG. 11A depicts comparator circuits for the second embodiment of the integrated circuit in accordance with the present invention.

FIG. 11A shows a practical embodiment of the comparator circuits 54 and 55. The comparator circuits 54 and 55 are each in the form of differential amplifier circuits which are arranged between a connection that applies a supply voltage Vcc and a connection that applies a reference voltage GND. The differential amplifier 54 includes an input connection E54a to apply the input signal bCLK and an input connection E54b to apply the reference signal V1. The output connection A50a of the differential amplifier circuit 54 produces the evaluation signal AS1. The differential amplifier circuit 55 includes an input connection E55a to apply the input signal bCLK and an input connection E55b to apply the reference signal V2. Its output connection A50b produces the evaluation signal AS2. A current source transistor ST54, which is actuated by a control signal Vref, is used by the differential amplifier circuit 54 to produce a parallel path current. Similarly, a current source transistor ST55 in the differential amplifier circuit 55 is actuated by the control signal Vref to produce a parallel path current. A switching transistor T54 or T55, which is actuated by an activation signal ACT, is used to activate/deactivate the differential amplifier circuit 54 or 55, respectively.

Figure 11B:
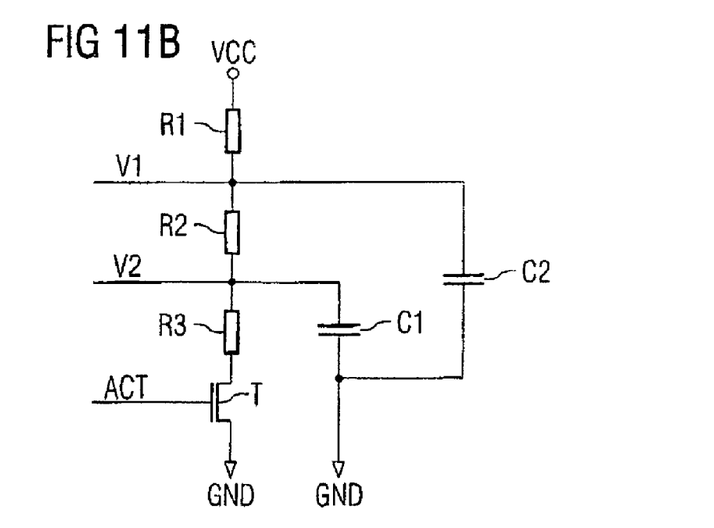
FIG. 11B depicts an integrated circuit for producing comparison voltages for the comparator circuits in accordance with the present invention.

FIG. 11B shows a circuit for producing the reference signals V1 and V2. In this case, the reference signals are produced by a resistance divider including the resistors R1, R2 and R3, which is connected between a connection that applies the supply voltage Vcc and a connection that applies the reference voltage GND. A switching transistor T allows the circuit to be activated/deactivated. The capacitors C1 and C2 serve as compensating elements.

Figure 12A:
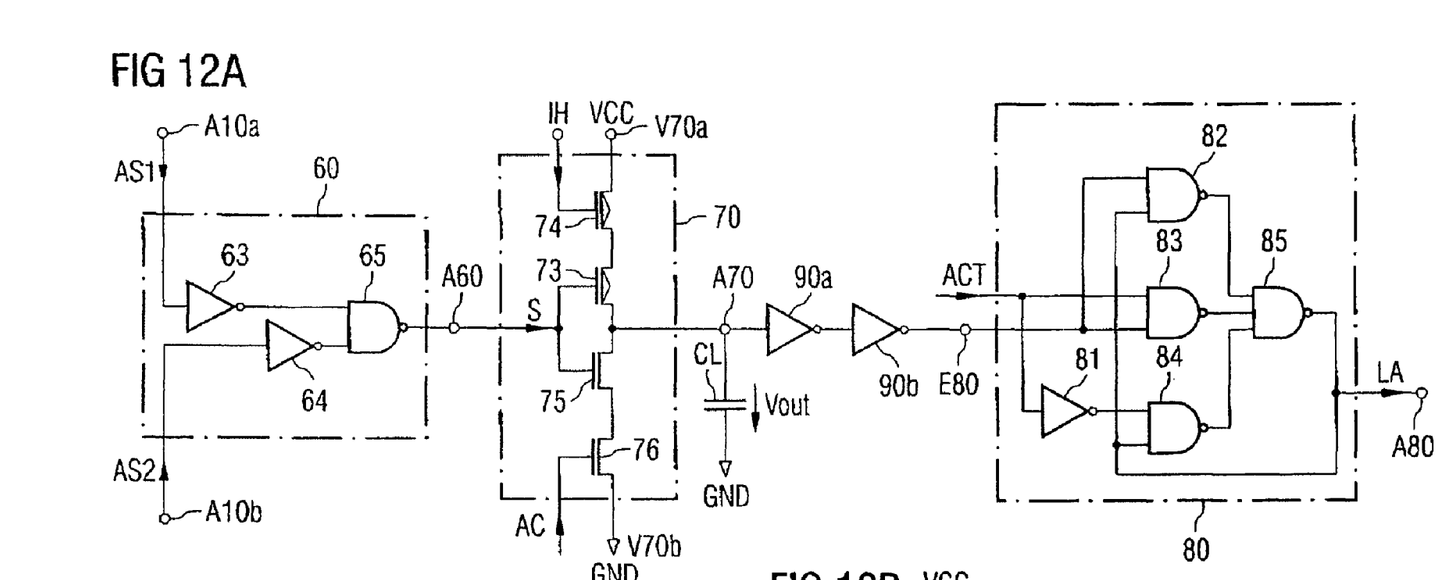
FIG. 12A depicts an integrated circuit with an evaluation circuit, a controllable current generator and a storage circuit in accordance with the present invention.

FIG. 12A shows practical embodiments of the evaluation circuit 60, of the controllable current generator 70 and of a storage circuit 80. The evaluation circuit 60 includes a NAND gate 65 whose input is connected to the output connection A50a of the differential amplifier circuit 54 via an inverter 63. In addition, the NAND gate 65 is connected to the output connection A60 of the differential amplifier circuit 55 via an inverter 64.

The controllable current generator 70 includes a p-channel switching transistor 73 and an n-channel switching transistor 75. The control connections of the two switching transistors are connected to the output connection A60 of the evaluation circuit 60. The p-channel switching transistor 73 is connected via a current source transistor 74 to the connection V70a to apply the supply voltage Vcc. The n-channel switching transistor 75 is connected via a switching transistor 76, which is used to activate/deactivate the controllable current generator, to the connection V70b to apply the reference voltage GND. In a similar manner to in the case of the differential amplifier circuits 54 and 55, the controllable current generator 70 also involves the activation signal ACT which is applied to a control connection of the switching transistor 76 being used to activate/deactivate the controllable current generator.

Figure 12B:
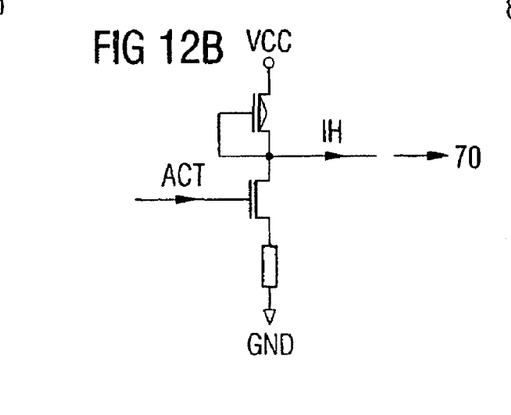
FIG. 12B depicts an integrated circuit for producing a control current for the controllable current generator in accordance with the present invention.

The charging current for charging the storage capacitor CL which is connected to the output connection A70 of the controllable current generator is impressed via a current mirror which is shown in FIG. 12B. The current mirror circuit can likewise be activated by the activation signal ACT.

A storage circuit 80 which is connected to the output connection A70 of the controllable current generator via a first inverter 90a and a second inverter 90b is used to buffer-store the voltage state of the storage capacitor CL. The storage circuit 80 includes an inverter 81 and NAND gates 82, 83 and 84, whose outputs are connected to a NAND gate 85. The storage circuit 80 can likewise be activated and deactivated by the activation signal ACT. Depending on the state of charge in the storage capacitor CL, the storage circuit 80 in the activated state produces an output signal LA with a low or high level at an output connection A80.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An integrated circuit to evaluate a signal, wherein said integrated circuit receives first and second input signals and said first input signal transitions between first and second states during a signal period, said integrated circuit comprising:

a first storage unit to store a state for said second input signal in response to said first input signal attaining said first state during said signal period;

a second storage unit to store a state for said second input signal in response to said first input signal attaining said second state during said signal period; and an evaluation unit to receive and compare said states of said second input signal stored in said first and second storage units to produce an evaluation signal, wherein said evaluation signal includes a first evaluation state in response to said state of said second input signal stored in said first storage unit differing from said state of said second input signal stored in said second storage unit, and wherein said evaluation signal includes a second evaluation state in response to said state of said second input signal stored in said first storage unit matching said state of said second input signal stored in said second storage unit;

wherein:

said first storage unit comprises a plurality of first storage devices coupled together in a serial fashion with each to store a respective state for said second input signal, wherein an initial first storage device receives said second input signal and remaining ones of said first storage devices receive said state of said second input signal stored within a preceding first storage device, and wherein said plurality of first storage devices produces said stored state as an output in response to said first input signal attaining said first state during said signal period; and said second storage unit comprises a plurality of second storage devices coupled together in a serial fashion with each to store a respective state for said second input signal, wherein an initial second storage device receives said second input signal and remaining ones of said second storage devices receive said state of said second input signal stored within a preceding second storage device, and wherein said plurality of second storage devices produces said stored state as an output in response to said first input signal attaining said second state during said signal period.

2. The integrated circuit of claim 1, wherein:
said plurality of first storage devices are in the form of a shift register; and
said plurality of second storage devices are in the form of a shift register.

3. The integrated circuit of claim 1, further comprising:
a control unit to produce first and second control signals from said first input signal in accordance with falling and rising edges of said first input signal to control said first and second storage units;
wherein said first control signal includes for said falling edge of said first input signal a first control state and a time delay relative to said falling edge of said first input signal and said second control signal includes for a falling edge of said first input signal a second control state and a time delay relative to said falling edge of said first input signal; and
wherein said first control signal includes for said rising edge of said first input signal said second control state and a time delay relative to said rising edge of said first input signal and said second control signal includes for said rising edge of said first input signal said first control state and a time delay relative to said rising edge of said first input signal.

4. The integrated circuit of claim 3, wherein:
said plurality of first and second storage devices are each actuated by said first and second control signals;
said plurality of first storage devices each stores a state of said second input signal in response to said first control signal attaining said first control state and produces said stored state of said second input signal in response to said second control signal attaining said first control state; and
said plurality of second storage devices each stores a state of said second input signal in response to said first control signal attaining said second control state and produces said stored state of said second input signal in response to said second control signal attaining said second control state.

5. The integrated circuit of claim 1, wherein:
said first and second storage devices are supplied with an initialization signal to initialize those storage devices.

6. The integrated circuit of claim 1, wherein each of said plurality of first and second storage devices comprises:
a first feedback inverter to receive said second input signal;
a second feedback inverter;
a first activatable inverter, wherein said first feedback inverter is connected at low impedance to said second feedback inverter via said first activatable inverter in response to activation of said first activatable inverter; and
a second activatable inverter, wherein said second feedback inverter is connected to a corresponding storage unit via said second activatable inverter.

7. The integrated circuit of claim 1, wherein said evaluation unit produces said evaluation signal with said first evaluation state in response to at least two first storage devices storing matching states of said second input signal, at least two second storage devices storing matching states of said second input signal, and at least one of corresponding first and second storage devices storing differing states of said second input signal.

8. The integrated circuit of claim 7, wherein said evaluation unit includes:
a first XNOR gate to receive and evaluate said stored states from at least two of said first storage devices;
a second XNOR gate to receive and evaluate said stored states from at least two second storage devices;
an XOR gate to receive said stored states from corresponding first and second storage devices; and
a NAND gate to receive outputs from said first and second XNOR gates and said XOR gate and produce said evaluation signal.

9. An integrated circuit to evaluate a signal, wherein said integrated circuit receives first and second input signals and said first input signal transitions between first and second states during a signal period, said integrated circuit comprising:
a first storage unit to store a state for said second input signal in response to said first input signal attaining said first state during said signal period;
a second storage unit to store a state for said second input signal in response to said first input signal attaining said second state during said signal period; and
an evaluation unit to receive and compare said states of said second input signal stored in said first and second storage units to produce an evaluation signal, wherein said evaluation signal includes a first evaluation state in response to said state of said second input signal stored in said first storage unit differing from said state of said second input signal stored in said second storage unit, and wherein said evaluation signal includes a second evaluation state in response to said state of said second input signal stored in said first storage unit matching said state of said second input signal stored in said second storage unit;
wherein said first input signal comprises a clock signal in an integrated semiconductor memory device and said second input signal comprises a complementary clock signal in said integrated semiconductor memory device.

10. A method for analyzing a waveform of a signal in an integrated circuit receiving first and second input signals and including first and second storage units to store states for said second input signal, wherein said first input signal effects first and second state changes within a signal period, said method comprising:
storing a state of said second input signal in said first storage unit in response to said first state change of said first input signal;
storing a state of said second input signal in said second storage unit in response to said second state change of said first input signal;
comparing said states stored in said first and second storage units;
producing an evaluation signal with a first state in response to said state of said second input signal stored in said first storage unit matching said state of said second input signal stored in said second storage unit; and
producing said evaluation signal with a second state in response to said state of said second input signal stored in said first storage unit differing from said state of said second input signal stored in said second storage unit;
wherein:
said first storage unit comprises at least two first storage devices to store said state for said second input signal and said second storage unit comprises at least two second storage devices to store said state for said second input signal;

said storing a state of said second input signal in said first storage unit further includes storing a state of said second input signal in an initial first storage device and transferring said stored states of said second input signal between said at least two first storage devices in response to said first state change in each signal period of said first input signal;

said storing a state of said second input signal in said second storage unit further includes storing a state of said second input signal in an initial second storage device and transferring said stored states of said second input signal between said at least two second storage devices in response to said second state change in each signal period of said first input signal;

said comparing includes comparing said state stored in at least two of said first storage devices, comparing said state stored in at least two of said second storage devices, and comparing said state stored in one of said first storage devices with said state stored in a corresponding one of said second storage devices; and said producing said evaluation signal with a second state includes producing said evaluation signal with said second state in response to at least two first storage devices storing matching states of said second input signal, at least two second storage devices storing matching states of said second input signal, and said corresponding ones of said first and second storage devices storing differing states of said second input signal.

11. The method of claim 10, further comprising:

initializing said first and second storage devices via an initialization signal.

12. The method of claim 10, further comprising:

producing first control signals from said first input signal to control said storing of said state of said second input signal in said first and second storage devices; and producing second control signals from said first input signal to control said transfer of said stored states between said first and second storage devices.

13. A method for analyzing a waveform of a signal in an integrated circuit receiving first and second input signals and including first and second storage units to store states for said second input signal, wherein said first input signal effects first and second state changes within a signal period, said method comprising:

storing a state of said second input signal in said first storage unit in response to said first state change of said first input signal;

storing a state of said second input signal in said second storage unit in response to said second state change of said first input signal;

comparing said states stored in said first and second storage units;

producing an evaluation signal with a first state in response to said state of said second input signal stored in said first storage unit matching said state of said second input signal stored in said second storage unit; and producing said evaluation signal with a second state in response to said state of said second input signal stored in said first storage unit differing from said state of said second input signal stored in said second storage unit;

wherein said first input signal comprises a clock signal in the integrated circuit and said second input signal comprises a complementary clock signal in the integrated circuit.

* * * * *